United States Patent

[11] 3,582,684

[72] Inventor Robert E. Gregson
Scottsdale, Ariz.
[21] Appl. No. 792,586
[22] Filed Jan. 21, 1969
[45] Patented June 1, 1971
[73] Assignee Motorola Inc.
Franklin Park, Ill.

[54] ZERO POINT SWITCHING CIRCUIT FOR INITIATING CONDUCTION OF SILICON-CONTROLLED RECTIFIERS
9 Claims, 5 Drawing Figs.

[52] U.S. Cl. .......... 307/252UA, 307/252N, 307/305
[51] Int. Cl. .......... H03k 17/00
[50] Field of Search .......... 307/252, 305, 133; 323/25

[56] References Cited
UNITED STATES PATENTS

| | | | |
|---|---|---|---|
| 3,335,291 | 8/1967 | Gutzwiller .......... | 307/252 |
| 3,440,445 | 4/1969 | Kusa .......... | 307/252 |

*Primary Examiner*—Donald D. Forrer
*Assistant Examiner*—John Zazworsky
*Attorney*—Mueller & Aichele

ABSTRACT: A zero point switching circuit for an SCR coupled in circuit relation with an AC source and a load is described. The combination of a switch, a first diode and a voltage divider is coupled across the source. The variable tap or terminal of the divider is coupled through a second diode and a capacitor to the first diode. When the switch is closed, the capacitor charges during one-half cycle toward a voltage level determined by the divider. The discharge path for the capacitor is provided by a three-layered diode coupled between the gate electrode of the SCR and the capacitor. When the line voltage decreases prior to the next half cycle, the capacitor voltage extends the threshold level of the three-layered diode. As a result, the diode becomes conductive thereby turning on the SCR at the zero point of the AC voltage.

PATENTED JUN 1 1971

3,582,684

INVENTOR.
Robert E. Gregson
BY
Mueller, Aichele, & Rauner
Attys

ZERO POINT SWITCHING CIRCUIT FOR INITIATING CONDUCTION OF SILICON-CONTROLLED RECTIFIERS

BACKGROUND OF THE INVENTION

This invention relates to switching circuits for gate-controlled semiconductor devices and, more particularly, to a zero point switching circuit for silicon-controlled rectifiers.

At present, gate control semiconductor devices are being increasingly utilized to control the power supplied from AC sources to a variety of loads. The commercial acceptance of these devices has resulted in part from their relatively small size and high efficiency. One of the best known members of this class of semiconductor devices is the SCR. Since conventional SCR control circuits generally permit the SCR to be switched on at any phase angle between zero degrees and 180° of the SCR anode to cathode voltage, varying magnitudes of radio frequency interference (RFI) are generated depending upon the circuit's mode of operation.

In operation, the switching on of an SCR at a phase angle above zero degrees or less than 180° results in a switching transient. Since these transients and the accompanying RFI are detrimental directly or indirectly to circuits operating in the same area, the switching transients should be minimized. In order to hold these transients to a minimum, two conditions should be met; (1) the turn-on drive signal should be applied to the gate electrode of the SCR as the anode voltage passes through the zero point, and (2) the circuit should be switched off as the current through the SCR passes through zero. When an SCR is utilized to control AC power, the latter of these two conditions is met automatically as a result of the inherent latching characteristics of the SCR. This latching characteristic provides natural commutation due to the fact that an SCR can only be turned off when the anode to cathode current falls below a minimum holding threshold. In the absence of an appropriate gate current, the SCR remains nonconductive. Consequently, the primary source of RFI is the switching transient resulting from a late or delayed turn-on drive signal.

Accordingly, the present invention is directed to a switching circuit which ensures that an SCR is rendered conductive at or just prior to zero crossover point of the applied AC anode voltage. As a result, the energy delivered to the load is essentially free of RFI and the need for filtering and/or shielding for the protection of other circuits is eliminated. Also, zero point switching enables maximum available power to be delivered to the load.

SUMMARY OF THE INVENTION

The present invention is directed to a control circuit for regulating the turn-on time of a gate controlled semiconductor device which is connected in circuit relation with an alternating voltage source and a load. The control circuit includes the combination of a switching means, a first unidirectional current means and a voltage divider coupled across the alternating source. The first current means is poled to pass current during the half cycle that the gate-controlled device, typically an SCR, is normally nonconductive, i.e., the half cycle when the anode is negative with respect to the cathode. The voltage divider of the combination is provided with a variable tap or terminal. This variable tap is coupled through a second unidirectional current means and a capacitor to the first current means. The second current means is poled to pass current flowing from the variable terminal of the divider to the capacitor.

The connection between the capacitor and the second current means is coupled through a voltage-controlled semiconductor device and a third unidirectional current means to the gate electrode of the gate-controlled device. The third current means is poled to pass current flowing from the capacitor to the gate electrode of the semiconductor device. The voltage-controlled device is characterized by the fact that it becomes conductive when the voltage thereacross reaches a predetermined threshold and remains conductive with a lower voltage drop thereacross.

The application of the circuit can be considered as beginning when the switch is closed. If the anode to cathode voltage across the gate-controlled device is positive, the first current means is nonconductive and nothing occurs until the cathode of the device starts going positive with respect to the anode. At this time, the first and second current means are conductive and the capacitor charges through the voltage divider and the second current means toward the limit of the voltage set by the position of the variable tap on the divider. When the cathode to anode voltage is at its maximum and starts to decrease, the capacitor is prevented from discharging because the second current means becomes nonconductive.

At this time, the capacitor is charged to its maximum voltage and the difference between this voltage and the voltage at the cathode of the gate-controlled device appears across the series combination of the voltage-controlled device, the third current means and the gate-cathode junction of the gate-controlled device. As the cathode voltage continues to drop toward zero, the voltage across the voltage-controlled device increases until it reaches the threshold voltage. Upon reaching the threshold voltage, the device conducts and breaks back to a lower voltage. As a result, the capacitor discharges through the combination of the voltage-controlled device, the third current means and the gate of the gate-controlled device. The discharge current of the capacitor continues to flow into the gate as the cathode to anode voltage crosses zero and ensures that the gate-controlled device is provided with turn-on drive as its anode voltage becomes positive with respect to the cathode.

The present circuit applies the turn-on drive signal to the gate electrode of the gate-controlled device just prior to the time that the voltage across this device becomes positive. Consequently, the switching transient is essentially eliminated and RFI is not generated.

Further features and advantages of this circuit will become more readily apparent from the following description of the preferred embodiment when taken in conjunction with the accompanying drawing.

DESCRIPTION OF THE PREFERRED EMBODIMENT

Figure 1:
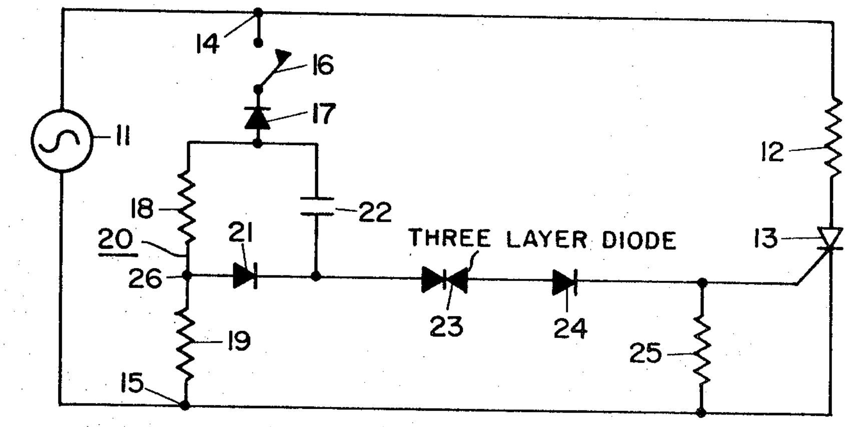
FIG. 1 is an electrical schematic diagram of one embodiment of the invention.

Referring now to FIG. 1, an alternating source 11 is shown coupled in circuit relation with load 12 and gate-controlled semiconductor device 13. When the gate-controlled device is rendered conductive, essentially the entire voltage between terminals 14 and 15 appears across the load 12. However, when the device 13, shown here as an SCR, is nonconductive, the alternating voltage appears across it. Thus, controlling the conductivity of the device 13 determines the power supplied to load 12.

The combination of switch 16, diode 17 and voltage divider 20 is shown coupled between terminals 14 and 15. Thus, the closing of switch 16 places the entire alternating voltage thereacross. In this embodiment, the voltage divider is shown including resistors 18 and 19 with a fixed terminal 26 therebetween. However, it will be recognized that a variable tap divider can be used if desired. Terminal 26 of the divider is coupled via diode 21 and capacitor 22 to the anode electrode of diode 17. In addition, the cathode electrode of diode 21 is coupled through three-layer diode 23 and diode 24 to the gate electrode of SCR 13.

The three-layer diode 23 shown in FIG. 1 is a voltage-controlled semiconductor device with two terminals and is characterized by the fact that it is essentially nonconductive until the voltage thereacross reaches a predetermined threshold voltage. When the voltage equals or exceeds this threshold voltage, the device conducts current and the voltage crop thereacross is substantially reduced. In one embodiment tested and operated, the voltage-controlled device remained nonconductive until it reached a voltage of approximately 30 volts whereupon the device began to conduct and the voltage thereacross dropped to about 20 volts. These voltage-controlled devices are commercially available. The difference between the voltages at the nonconductive and conductive states of the device is normally determined by the constructional features of the particular device selected.

In describing the operation of the circuit, the switch 16 is initially assumed to be open and an alternating voltage appears between terminals 14 and 15. During the negative half cycle of the voltage, taken herein to describe the situation wherein the voltage at terminal 15 is positive with respect to the voltage at terminal 14, the SCR 13 is nonconductive since its cathode voltage is greater than its anode voltage. As a result, no voltage appears across load 12 during the negative half cycle. During the positive half cycle when terminal 14 is at a more positive voltage than terminal 15, the SCR 13 is nonconductive in the absence of a turn-on drive current applied to its gate electrode. If switch 16 is closed during the positive half cycle, time $T_1$ in FIG. 2, nothing occurs due to the fact that diode 17 is reversed bias and no gate current is supplied to SCR 13.

Figure 4:
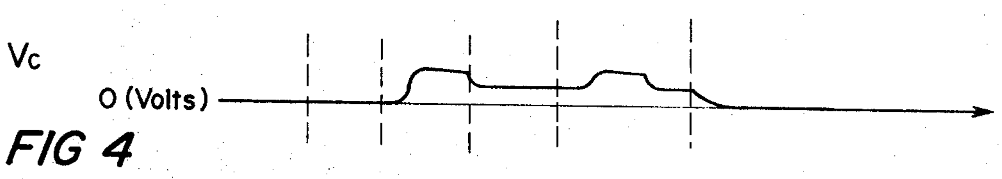

During the following half cycle after time $T_2$, when the voltage at terminal 15 starts going positive with respect to the voltage at terminal 14, the capacitor 22 begins to charge through resistor 19 as shown in FIG. 4.

In this negative half cycle of the alternating voltage, the capacitor charges toward the limit of voltage determined by the relative magnitudes of resistors 18 and 19. In the embodiment shown, resistor 19 was chosen to be twice the size of resistor 18. In combination with an alternating voltage of 120 volts, capacitor 22 charged to approximately 40 volts. The capacitor reaches it maximum voltage at the approximate point when the voltage between terminals 14 and 15 is at its negative maximum. However, capacitor 22 is prevented at this time from discharging because the voltage at the cathode electrode of diode 21 is sufficient to reverse bias the diode. At this point in time, the cathode electrode of diode 21 is maintained at the capacitor voltage and the cathode of SCR 13 is at the voltage at terminal 15. Thus, the difference in the capacitor voltage and the voltage at terminal 15 appears across the combination of voltage-controlled device 23, diode 24 and the gate-cathode junction of SCR 13. As the voltage at terminal 15 drops further toward the zero level, the voltage across the voltage-controlled device 23 increases to the point where it reaches the device threshold voltage. Then, the device 23 begins to conduct current from the capacitor and breaks back to a lower voltage. This discharge current is supplied through diode 24 to the gate electrode of SCR 13 and constitutes a turn-on drive current.

Figure 5:
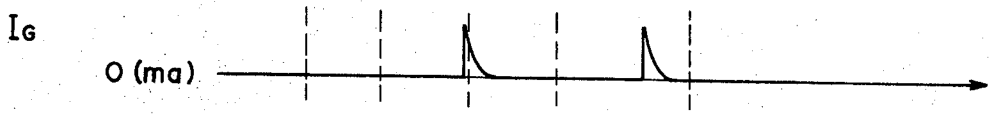

The discharge current of capacitor 22, shown in FIG. 5, continues to flow into the gate of SCR 13 as the voltage at terminal 15 with respect to terminal 14 approaches zero at time $T_3$ and continues to flow as terminal 14 becomes positive with respect to terminal 15. Consequently, the turn-on drive current is present at the point in time $T_3$ when the anode of SCR 13 is positive with respect to its cathode and the SCR starts conducting. Thus, the switching transient has been essentially eliminated.

Figure 2:
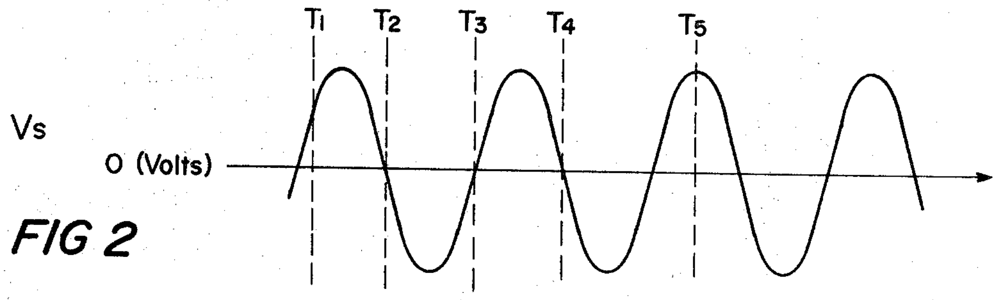
FIGS. 2—5 illustrate wave forms occurring at various points in the embodiment of FIG. 1.
Figure 3:
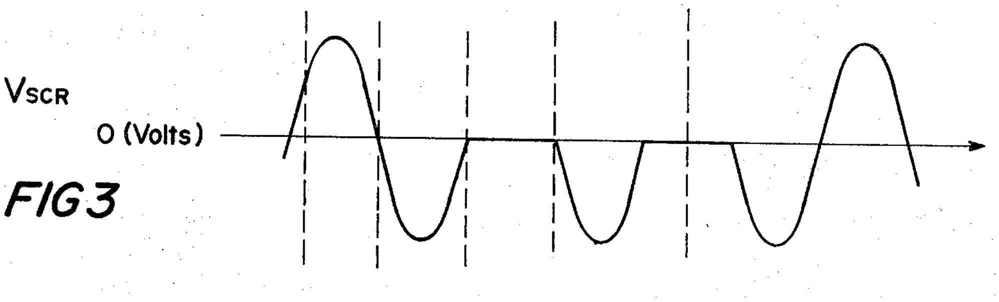

The wave forms of FIGS. 2—5 illustrate the aforesaid described operation and show the voltage $V_C$ across capacitor 22 dropping to about 20 volts and providing the turn-on drive current, i.e., at the time that the alternating voltage $V_S$ shown in FIG. 2 starts its positive half cycle. At this time, the SCR 13 is rendered conductive and the voltage thereacross $V_{SCR}$ remains essentially at zero until the start of the following half cycle. While the gate current $I_G$ provides the turn-on drive and continues to flow for a portion of the positive half cycle, it is characteristic of gate-controlled devices that conduction continues, either in the presence or absence of a gate current, when it has been initially triggered until the anode current decreases to a minimum holding value. The capacitor voltage $V_C$ shown in FIG. 4 remains at about a 20-volt level during the positive half cycle as shown in FIG. 4. At time $T_4$, the alternating source voltage begins the negative half cycle and the SCR is latched into nonconduction. In addition, the voltage on the capacitor 22 begins to increase until the maximum voltage point of the negative half cycle and remains substantially constant until the capacitor again discharges through device 23 into the gate electrode of SCR 13. The opening of switch 16 at time $T_5$ does not affect the conduction of the SCR which is under the control of its anode to cathode voltage and the current flowing therebetween. As a result, the SCR remains conductive until the following negative half cycle.

The diode 24 coupled between the voltage-controlled device 23 and the gate electrode of SCR 13 is poled to pass the turn-on drive current. As a result, the diode plays no part in the turn-on period or conducting period of SCR 13. It is included in the embodiment shown to prevent reverse gate current from flowing at any time in SCR 13. This is due to the fact that voltage-controlled device 23 is typically a bilateral device and consequently the combination of device 23 and the gate-cathode junction of SCR 13 are insufficient to withstand the entire reverse voltage during the half cycle that the SCR is nonconductive. The resistor 25 is utilized in the embodiment of FIG. 1 to ensure against false triggering of the SCR due to leakage currents which might occur during operation. As previously mentioned, the voltage to which capacitor 22 charges is determined by the voltage divider 20. Since the difference between the capacitor voltage and the voltage at terminal 15 determines the point at which the turn-on drive current is first supplied to gate 13, i.e., when device 23 conducts current, the particular setting of the voltage divider is selected in accordance with the threshold voltage of device 23. In a particular embodiment tested and operated, the alternating voltage of source 11 was 120 volts r.m.s., the ratio of resistor 19 to resistor 18 was 2 to 1, so that the capacitor 22 charged to approximately 40 volts. The three-layer diode utilized as device 23 had a threshold voltage of about 28 volts. Thus, this circuit operated with voltage-controlled device breaking back to its lower voltage and conducting when the voltage at terminal 15 was 10 volts positive with respect to the voltage at terminal 14. Since the rate of change of the alternating wave form is greatest at or near the zero level, the duration of the gate current is sufficient to insure the turn-on of SCR 13 at the zero point. The duration of the gate current supplied to the SCR is determined primarily by the time constant of the capacitor 22 and the total resistance of resistors 18 and 19. This time constant is made sufficiently long enough to ensure that current is still supplied to the gate electrode of the SCR, when the anode-cathode voltage reverses and the SCR becomes conductive.

While the above description has referred to specific embodiment of the invention, it will be recognized that many modifications and variations may be made therein without departing from the spirit and scope of the invention.

What I claim is:

1. A control circuit for regulating the turn-on time of a gate-controlled semiconductor device which is connected in circuit relation with an alternating source and a load, said circuit comprising:

a. first unidirectional current means having first and second electrodes and poled to pass current flowing from said first to second electrodes;

b. a voltage divider having first, second and third terminals, the first terminal of said divider being coupled to the first electrode of said first current means, the second electrode of said first current means and the second terminal of said voltage divider being coupled to the alternating source, the voltage appearing at the third terminal being less than the voltage appearing between the first and second terminals thereof;

c. a second unidirectional current means having first and second electrodes and poled to pass current flowing from said first to second electrodes, the first electrode of said second current means being coupled to the third terminal of said voltage divider;

d. a capacitor coupled between the first electrode of said first current means and the second electrode of said second current means;

e. a voltage-controlled semiconductor device coupled between the second electrode of said second current means and the gate electrode of said gate-controlled device, said voltage-controlled device becoming conductive when the voltage thereacross reaches a predetermined threshold, said capacitor being charged to a voltage exceeding the threshold of the voltage-controlled device by the alternating source whereby the capacitor discharges through the voltage-controlled device and into the gate electrode of the gate-controlled device.

2. The circuit in accordance with claim 1 further comprising third unidirectional current means having first and second electrodes and poled to pass current flowing from said first to second electrodes, said first electrode being coupled to the voltage-controlled device, said second electrode being coupled to the gate electrode of the gate-controlled device.

3. The circuit in accordance with claim 2 further comprising switching means connected in circuit relation with said first current means and said voltage divider.

4. The circuit in accordance with claim 3 wherein said voltage-controlled device is a three-layered diode.

5. The circuit in accordance with claim 4 wherein said gate-controlled device is a silicon control rectifier.

6. The circuit in accordance with claim 5 wherein said first, second and third current means are diodes.

7. The circuit in accordance with claim 6 further comprising a resistor coupled between the second electrode of said third current means and the second terminal of said voltage divider.

8. A control circuit for regulating the turn-on time of a gate-controlled semiconductor device which is connected in circuit relation with an alternating source and a load, said circuit comprising:

a. switching means having first and second terminals, the first terminal of said switching means being connected in circuit relation with the alternating source;

b. a first diode having first and second electrodes, said diode being poled to pass current flowing from said first to second electrodes, said second electrode being coupled to the second terminal of said switching means;

c. a voltage divider having first, second and third terminals, the first terminal of said divider being coupled to the first electrode of said first diode, the second terminal of said divider being coupled in circuit relation with the alternating source;

d. a second diode having first and second electrodes, said diode being poled to pass current flowing from said first and second electrodes, the first electrode of said second diode being coupled to the third terminal of said voltage divider;

e. a capacitor having first and second terminals, the first terminal of said capacitor being coupled to the second electrode of said second diode, the second terminal of said capacitor being coupled to the first electrode of said first diode;

f. a voltage-controlled semiconductor device having first and second electrodes, said device becoming conductive when the voltage thereacross reaches a predetermined threshold, the first electrode of said device being coupled to the first terminal of said capacitor, and g. a third diode having first and second electrodes said third diode being poled to pass current flowing from said first to second electrodes, said first electrode being coupled to the second electrode of said voltage-controlled device, the second electrode of said third diode being coupled to the gate electrode of said gate-controlled device, the actuation of said switching means charging said capacitor to a voltage exceeding the threshold of said voltage-controlled device whereby a turn-on drive current is supplied to the gate electrode of said gate-controlled device.

9. The circuit in accordance with claim 8 wherein said voltage-controlled device is a three-layered diode.